(12) United States Patent
Cho et al.

(10) Patent No.: US 11,888,292 B2
(45) Date of Patent: Jan. 30, 2024

(54) IMAGE ACQUIRING DEVICE

(71) Applicant: LG ELECTRONICS INC., Seoul (KR)

(72) Inventors: Ayoung Cho, Seoul (KR); Changhwan Lee, Seoul (KR); Yunsup Shin, Seoul (KR)

(73) Assignee: LG ELECTRONICS INC., Seoul (KR)

(*) Notice: Subject to any disclaimer, the term of this patent is extended or adjusted under 35 U.S.C. 154(b) by 311 days.

(21) Appl. No.: 17/039,844

(22) Filed: Sep. 30, 2020

(65) Prior Publication Data

US 2021/0305784 A1 Sep. 30, 2021

(30) Foreign Application Priority Data

Mar. 27, 2020 (KR) .......... 10-2020-0037364

(51) Int. Cl.
*H04N 25/00* (2023.01)
*H01S 5/183* (2006.01)
(Continued)

(52) U.S. Cl.
CPC .......... *H01S 5/18397* (2013.01); *H01S 3/102* (2013.01); *H04N 25/00* (2023.01); *H05B 47/14* (2020.01)

(58) Field of Classification Search
CPC .. H01S 3/102; H01S 5/04256; H01S 5/18397; H01S 5/4087; H01S 5/4093; H01S 5/423; H04N 5/332; H04N 5/335; H04N 9/04553; H04N 9/04559; H04N 9/07; H04N 23/11; H04N 23/12; H04N 25/00; H04N 25/131; H04N 25/135; H05B 45/20; H05B 47/14
See application file for complete search history.

(56) References Cited

U.S. PATENT DOCUMENTS

2015/0227790 A1 8/2015 Smits
2018/0038944 A1* 2/2018 Hellmig ................ G01S 17/894
(Continued)

FOREIGN PATENT DOCUMENTS

JP 2015099910 5/2015
KR 1020080039769 5/2008
(Continued)

OTHER PUBLICATIONS

PCT International Application No. PCT/KR2020/009111, International Search Report dated Dec. 23, 2020, 4 pages.

*Primary Examiner* — Antoinette T Spinks
(74) *Attorney, Agent, or Firm* — LEE, HONG, DEGERMAN, KANG & WAIMEY

(57) ABSTRACT

Provided is an image acquiring device for easily acquiring a hyper spectral image in a small device and enhancing wavelength resolution, the device which includes a light source portion and a sensor portion. The light source portion includes an emitter portion having a plurality of groups of emitters configured to emit light of different wavelengths, a circuit portion dividing the emitter portion into a plurality of segments and configured to control the plurality of segments independently, and a driver portion configured to control the circuit part so that the plurality of segments are driven at different strengths or at different times.

13 Claims, 13 Drawing Sheets

(51) Int. Cl.
*H01S 3/102* (2006.01)
*H05B 47/14* (2020.01)

(56) References Cited

U.S. PATENT DOCUMENTS

| | | | |
|---|---|---|---|
| 2018/0132330 A1* | 5/2018 | Chong | F21S 41/153 |
| 2020/0041646 A1 | 2/2020 | Pacala et al. | |
| 2020/0342194 A1 | 10/2020 | Bhat et al. | |

FOREIGN PATENT DOCUMENTS

| | | |
|---|---|---|
| KR | 1020190028429 | 3/2019 |
| KR | 1020200024914 | 3/2020 |
| WO | 2008054130 | 5/2008 |

* cited by examiner

IMAGE ACQUIRING DEVICE

CROSS-REFERENCE TO RELATED APPLICATION(S)

Pursuant to 35 U.S.C. § 119(a), this application claims the benefit of earlier filing date and right of priority to Korean Patent Application No. 10-2020-0037364 filed on Mar. 27, 2020, the contents of which are hereby incorporated by reference herein in its entirety.

BACKGROUND

1. Field

The present disclosure relates to an image acquiring device including a lighting device and a camera and capable of acquiring an image of a subject.

2. Description of the Related Art

The image acquiring device refers to a device having an optical system for acquiring an image of a subject. The image acquiring device may be implemented in the form of a dedicated device for acquiring images, such as a digital camera or an infrared camera, or may be implemented in the form of a terminal for performing other functions, such as a smart phone.

In particular, with the development and wide spread of smartphones in recent years, the usability of images has been greatly improved. Accordingly, there are increasing demands for an image acquiring device for acquiring not just RGB images of a visible wavelength band but also hyperspectral or multispectral images of a wider and subdivided wavelength band.

In order to acquire a hyperspectral or multispectral image, a camera or a lighting device must have corresponding specifications. That is, a camera capable of receiving light with distinguishing a plurality of wavelengths, or a lighting device capable of emitting light of the plurality of wavelengths is required.

In order to acquire a hyperspectral or multispectral image, a lighting device covering a wide wavelength band, such as a UV, halogen, or LED lighting device, has been used as well as a camera capable of receiving light with distinguishing the wide wavelength band.

However, such a typical lighting device has problems, such as the use of halogen, relatively great heat generation, and relatively large power consumption. These problems are considered a substantial drawback in developing small devices which are recently on trend.

In addition, a controller for controlling such a lighting device occupies a large space, and thus, the controller is inadequate for a small device.

In addition, since the typical lighting device is wide in wavelength width, it is difficult to extract and use only information on a target wavelength.

SUMMARY

An aspect of the present disclosure is to solve the above-described problems that a lighting device for acquiring a multispectral or hyperspectral image is not inadequate to be mounted in a small device, and that accurate information cannot be obtained because an image of only a desired wavelength component cannot be acquired.

According to an aspect of the present disclosure, there is provided an image acquiring device comprising a light source portion and a sensor portion. The light source portion includes an emitter portion having a plurality of groups of emitters configured to emit light of different wavelengths, wherein each of the plurality of groups correspond to each of the wavelengths, a circuit portion configured to independently control a plurality of segments into which the emitter portion is divided, and a driver portion configured to control the circuit portion so that the plurality of segments are driven at different strengths or at different times.

Further, according to another aspect of the present disclosure, each of the plurality of segments may include a plurality of groups of emitters.

Further, according to another aspect of the present disclosure, the driver portion may be configured to drive the plurality of segments sequentially.

Further, according to another aspect of the present disclosure, the driver portion may be driven so that a plurality of emitters belonging to a same segment are all driven at a same time, and the sensor portion may be configured to change a wavelength of received light according to a time or a region.

Further, according to another aspect of the present disclosure, after a first group of emitters are driven according to a driving order of the plurality of segments, a second group of emitters may be sequentially driven according to the driving order of the plurality of segments.

Further, according to another aspect of the present disclosure, the sensor portion may be configured to change a wavelength of received light according to a time or a region or to receive light regardless of wavelength.

Further, according to another aspect of the present disclosure, a duration during which one of the plurality of groups of emitters are driven with respect to all of the plurality of segments may correspond to a unit frame time of the image acquiring device.

Further, according to another aspect of the present disclosure, each of the plurality of segments may have a plurality of emitters arranged in a same pattern.

Further, according to another aspect of the present disclosure, the sensor portion may be divided into regions to form a unit pixel that corresponds to a minimum unit for receiving light of a plurality of wavelengths, and a wavelength pattern of pixels in the unit pixel may correspond to a wavelength pattern of emitters provided in each of the plurality of segments.

Further, according to another aspect of the present disclosure, pixels corresponding to wavelengths numerically close to each other in the unit pixel may be provided spatially adjacent to each other.

Further, according to another aspect of the present disclosure, each of the plurality of segments may include one group of the plurality of groups of emitters.

Further, according to another aspect of the present disclosure, the plurality of segments may be arranged in an m*n matrix where m and n denote natural numbers, and a plurality of emitters in each segment may be arranged in a p*q matrix where p and q denote natural numbers.

Further, according to another aspect of the present disclosure, the plurality of groups of emitters may include an R-wavelength emitter, a G-wavelength emitter, a B-wavelength emitter, and an IR-wavelength emitter.

Further, according to another aspect of the present disclosure, the plurality of groups of emitters may correspond to vertical cavity surface emitting lasers (VCSELs).

Further, according to another aspect of the present disclosure, the sensor portion may be provided as at least two sensor subportions, and a pattern of arrangement of emitters in a first segment of the plurality of segments may be different from a pattern of arrangement of emitters in a second segment of the plurality of segments.

Further, according to another aspect of the present disclosure, the driver portion may be further configured to drive a plurality of emitters in a manner in which a brightness of emitters in an outer segment among the plurality of segments is brighter than brightness of emitters in an inner segment among the plurality of segments.

BRIEF DESCRIPTION OF THE DRAWINGS

The above and other aspects, features, and advantages of certain embodiments will be more apparent from the following detailed description taken in conjunction with the accompanying drawings, in which.

DETAILED DESCRIPTION

Figure 1A:
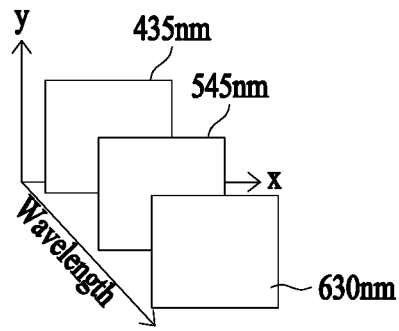
FIGS. 1A to 1C is a conceptual diagram sequentially illustrating an RGB spectrum, a multispectrum, and a hyperspectrum which are related to the present disclosure.

Hereinafter, exemplary embodiments disclosed herein will be described in detail with reference to the accompanying drawings, but the same or similar elements are assigned the same reference numbers regardless of the reference numerals, and overlapping descriptions thereof will be omitted. The suffixes "modules" and "parts" for the components used in the following description are given or mixed only considering the ease of writing the specification, and do not have meanings or roles distinguished from each other in themselves. In addition, in describing the embodiments disclosed in the present specification, when it is determined that detailed descriptions of related known technologies may obscure the gist of the embodiments disclosed herein, detailed descriptions thereof will be omitted. In addition, the accompanying drawings are only for easy understanding of the embodiments disclosed in the present specification, and the technical spirit disclosed in the specification is not limited by the accompanying drawings, and all modifications included in the spirit and technical scope of the present disclosure, It should be understood to include equivalents or substitutes.

Figure 1B:
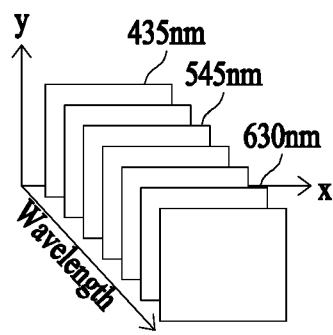
Figure 1C:
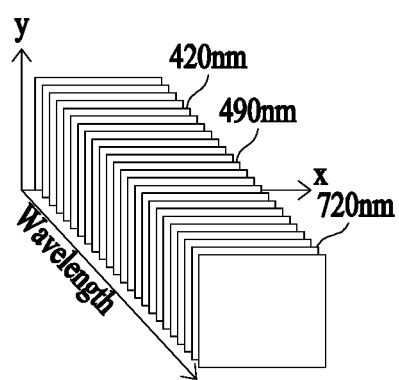

FIGS. 1A to 1C are conceptual diagrams sequentially illustrating an RGB spectrum, a multispectrum, and a hyperspectrum which are related to the present disclosure.

Referring to FIG. 1A, an RGB image may typically include information on three major wavelengths. These three wavelengths may correspond to red, green, and blue.

Referring to FIG. 1B, a multispectrum may be generally defined as a spectrum that includes information on 3 to 10 wavelength bandscompared to the RGB wavelengths.

Referring to FIG. 1C, the hyperspectrum may be defined as a spectrum that includes information on hundreds of wavelengths compared to the RGB wavelengths.

An image having a wavelength component of the RGB spectrum may be defined as an RGB image, an image having a wavelength component of the multispectrum may be defined as a multi-spectral image, and an image having a wavelength component of the hyperspectrum may be defined as a hyperspectral image.

The multispectrum or the hyperspectrum may not only include a wavelength band of the RGB wavelengths but also include a wavelength smaller than the minimum wavelength (435 nm) in the RGB spectrum or a wavelength greater than the maximum wavelength (630 nm) in the RGB spectrum. For example, the multispectrum or the hyperspectrum may include an infrared (IR) band.

The present disclosure includes features for acquiring a multispectral or hyperspectral image. However, it is easy to acquire a multispectral image or a hyperspectral image, and it does not mean that the present disclosure cannot be used to acquire a typical RGB image, an RGB-IR image, or the like. For this reason, it will be described as an example that all images are hyperspectral images.

Figure 2A:
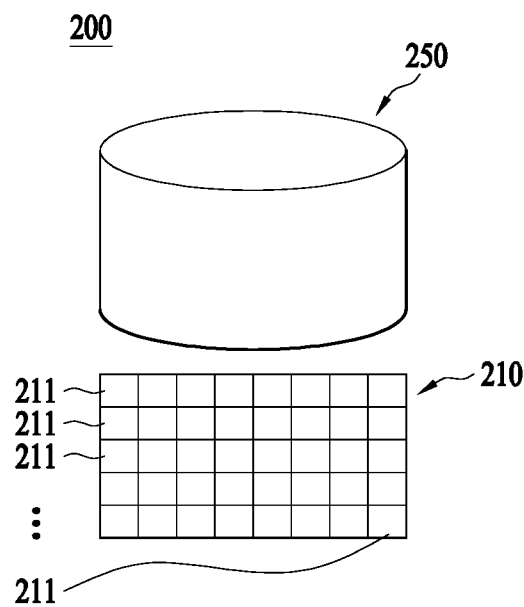
FIG. 2A and FIG. 2B are conceptual diagrams of an image acquiring device related to the present disclosure.
Figure 2B:
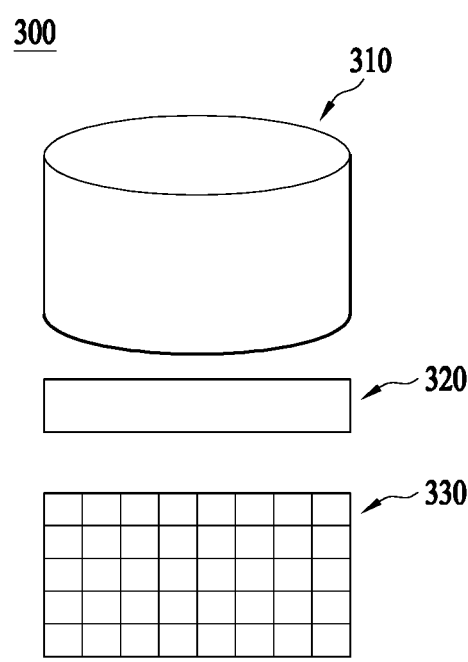
Figure 3:
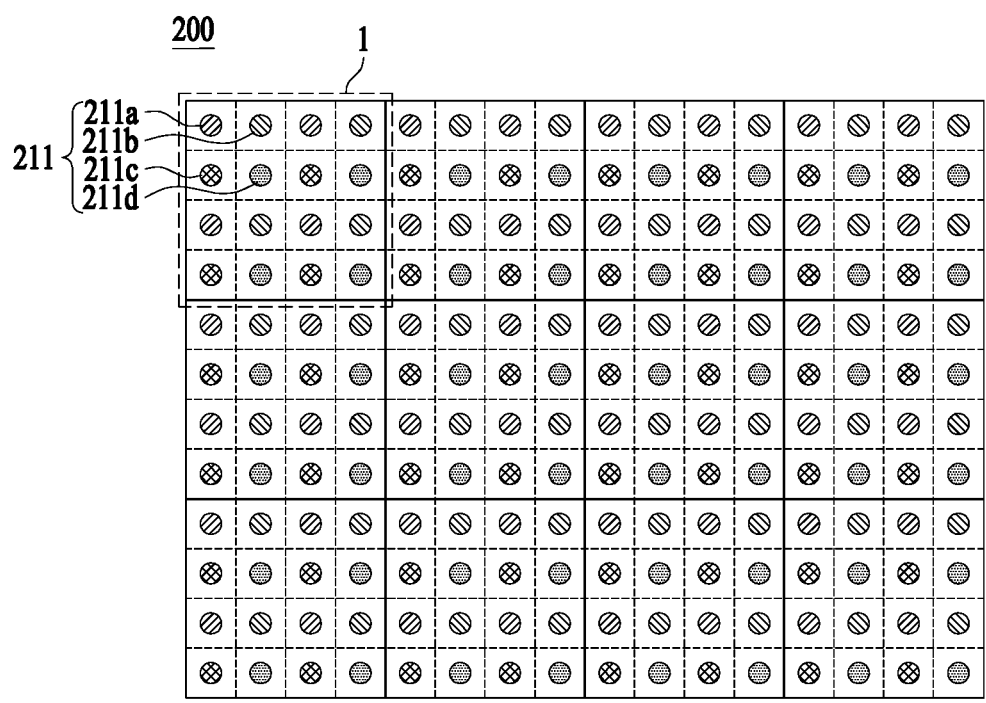
FIG. 3 illustrates an example of an emitter portion related to the present disclosure.

FIGS. 2A and 2B are a conceptual diagrams of an image acquiring device related to the present disclosure, and FIG. 3 shows an example of an emitter portion 210 related to the present disclosure.

FIG. 2A is a conceptual diagram of a light source portion 200, and FIG. 2B is a conceptual diagram of a sensor portion 300. The light source portion 200 may be a concept corresponding to the aforementioned lighting device, and the sensor portion 300 may be a concept corresponding to the aforementioned camera.

The image acquiring device may include the light source portion 200 and the sensor portion 300. The light source portion 200 may emit light of a predetermined wavelength or a wavelength band including the predetermined wavelength to the subject. Light emitted from the light source portion 200 may be reflected by the subject, and a part of the reflected light may be received by the sensor portion 300 and acquired as an image.

More specifically, the light source portion 200 may include an emitter portion 210 and an optical member 250, and the emitter portion 210 may include at least one emitter 211.

The optical member 250 may diffract or refract emitted light. The optical member 250 may include a lens that is a refractive element, a diffuser that is a diffractive element, a diffractive optical element (DOE), or a combination of the lens and the diffractive element.

The emitter 211 may be defined as the minimum unit of light emitting member. In the case where the emitter portion 210 includes a plurality of emitters 211, each emitter 211 may be driven independently of other emitters 211.

The emitter portion 210 may be divided into a plurality of segments 1 and may be driven independently in units of the segments 1. That is, the plurality of emitters 211 of the emitter portion 210 may perform an on/off operation, a strength control, and the like in units of the segments 1.

Each segment 1 may correspond to at least one emitter 211. Operations of the plurality of emitters 211 corresponding to one segment 1 may be performed simultaneously, but the present disclosure is not limited thereto. For example, operations of the plurality of emitters 211 corresponding to one segment 1 may be performed individually.

In order to drive the segments 1 independently, a circuit portion may be connected such that the respective segments 1 can be controlled in a divisional manner. Furthermore, when it is necessary to independently drive a plurality of emitters 211 corresponding to one segment 1, the circuit portion may be more subdivided and connected such that the respective emitters 211 can be controlled in a divisional manner.

A driver portion may drive the respective segments 1 or the respective emitters 211 independently using the circuit portion connected as described above.

The sensor portion 300 may receive light reflected by a subject and image the light. The sensor portion 300 may include a lens 310, a filter 320, and an image sensor 330.

The lens 310 may adjust the focus so that a light can properly arrive at the filter 320 and the image sensor 330. The image sensor 330 may acquire a clear image using the lens 310.

The filter 320 may selectively transmit light passing through the lens 310 according to a wavelength so that the transmitted light can arrive at the image sensor 330.

The sensor portion 300 may be implemented in the form of a multi-sensor portion capable of receiving light with distinguishing a plurality of wavelengths, or may be implemented in the form of a single sensor portion capable of receiving light without distinguishing wavelengths. More specifically, the multi-sensor portion may acquire an image corresponding to a wavelength desired to be acquired by a filter 320 that selectively transmits wavelengths.

The filter 320 may be spatially divided to transmit a plurality of wavelengths, or may be temporally divided to transmit a plurality of wavelengths. The sensor portion 300 implemented as the former type may be defined as a spatial multi-sensor portion, and the sensor portion 300 implemented as the latter type may be defined as a temporal multi-sensor portion.

In the spatial multi-sensor portion, the filter 320 may be divided into a plurality of regions that transmit different wavelengths, and the plurality of regions may simultaneously transmit light of the different wavelengths to acquire an image. In the temporal multi-sensor portion, a plurality of filters 320 transmitting different wavelengths may be selectively used to allow light to arrive at the image sensor 330. For example, in the case of the temporal multi-sensor portion, a plurality of filters 320 transmitting a single wavelength may be provided in a rotating circular member such that the plurality of filters 320 is sequentially arranged between the lens 310 and the image sensor 330.

The spatial multi-sensor portion is able to acquire information on all wavelength components in one frame but has a relatively low resolution, and therefore, an algorithm for compensating for the low resolution is needed. On the other hand, since the filter 320 of the temporal multi-sensor portion needs to be replaced physically, the temporal multi-sensor portion needs a driving system for a physical driving, and a space. If a general sensor is used, a frame rate may be relatively low.

In order to acquire a hyperspectral image using broadband lighting (or sunlight) regardless of wavelength, the image acquiring device should have the filter 320 which is implemented in the form of the spatial multi-sensor portion or the temporal multi-sensor portion, and which corresponds to a plurality of target wavelengths.

However, since the broadband lighting is wide in wavelength width, it is difficult to acquire accurate data on target wavelength components using the broadband lighting. Therefore, it is preferable that the light source portion has a narrow band whose wavelength width is small. That is, the light source portion 200 may be divided according to a plurality of target wavelengths. In order to provide light sources of the individual wavelengths, the light source portion 200 of the present disclosure mat include an emitter portion 210 composed of a plurality of groups of emitters 211 that emits light of different wavelengths. Each of the plurality of groups corresponds to each of the wavelengths. For example, the emitter portion 210 may include a first-group emitter, a second-group emitter, a third-group emitter, and a fourth-group emitter. More specifically, the first-group emitter may be an emitter 211$a$ that emits light of R-wavelength, the second-group emitter may be an emitter 211$b$ that emits light of G-wavelength, the third-group emitter may be an emitter 211$c$ that emits light of B-wavelength, and the four-group emitter may be an emitter 211$d$ that emits IR-wavelength light. However, the R-, G-, B-, and IR-wavelengths are merely examples and may be changed according to target wavelengths. In addition, the number of the wavelengths are not limited to 4 but may be less or more than 4.

Each emitter 211 may be implemented as a laser diode (LD). In particular, each emitter 211 may be implemented as a vertical cavity surface emitting laser (VCSEL) to form a very narrow band, for example 3 nm.

The plurality of groups of emitters 211 may be driven at the same time or may be driven at different times.

In this case, the driving the plurality of groups of emitters 211 at the same time may mean that only emitters 211 of the same wavelength can be driven at the same time. For example, the first-group emitter may emit light and be turned off, the second-group emitter may emit light and be turned off, and, in turn, the third-group emitter may emit light and be turned off. This is distinguished from the two-way driving of the segment 1. The two-way driving of the segments 1 may be a type of driving implemented such that at least one emitter 211 belonging to the first segment 1 is driven and then at least one emitter 211 belonging to the second segment 1 following the first segment 1 is driven.

In the case where the plurality of groups of emitters 211 are driven at different times, the shape of the sensor portion 300 is not limited. That is, the sensor portion 300 may be implemented in any form of a temporal multi-sensor portion or a spatial multi-sensor portion. For example, the sensor portion 300 may be provided in the form of a multi-filter that transmits numerous wavelengths, an RGB filter that transmits RGB wavelengths, or an RGB-IR filter that transmits RGB and IR-wavelengths. In addition, a single sensor portion implemented in the form of a mono filter is also possible.

On the other hand, in the case where the plurality of groups of emitters 211 are driven at the same time, it is possible to acquire an image having multiple wavelength components only when the sensor portion 300 is implemented in the form of a temporal multi-sensor portion or a spatial multi-sensor portion.

Figure 4:
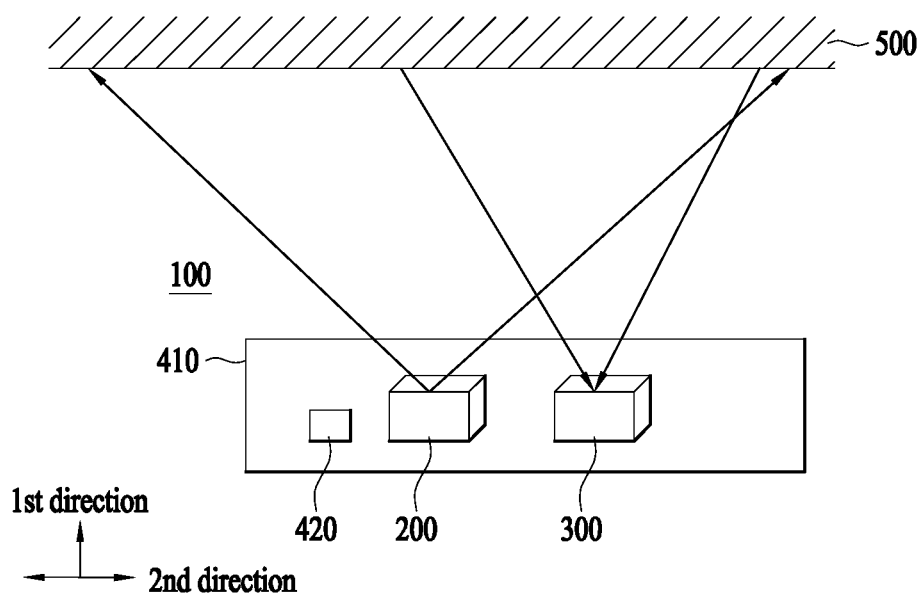
FIG. 4 is conceptual diagrams of one embodiment of an image acquiring device related to the present disclosure.
Figure 5:
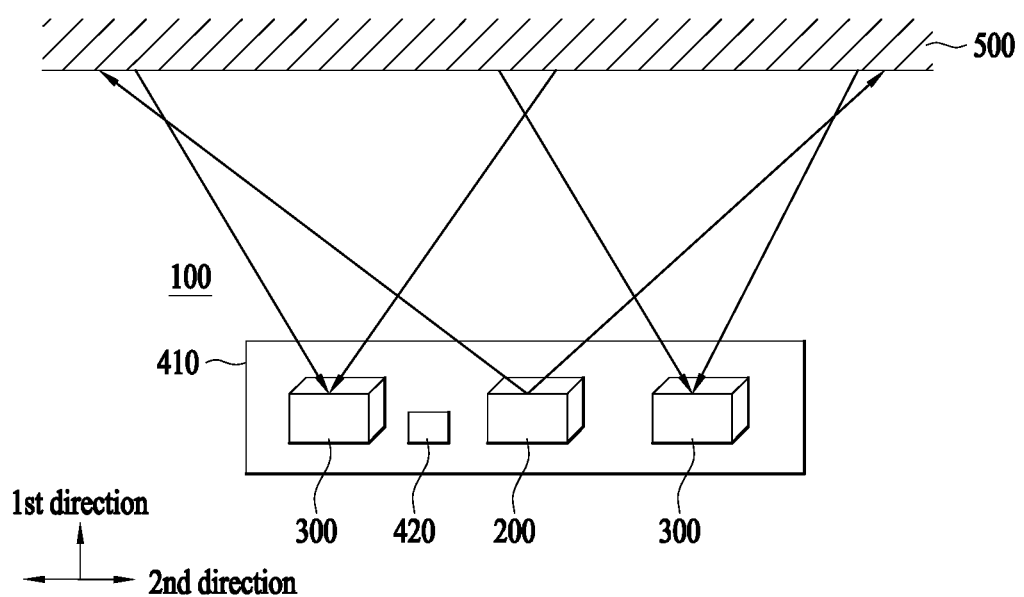
FIG. 5 is conceptual diagram of one embodiment of an image acquiring device related to the present disclosure.

FIGS. 4 and 5 are conceptual diagrams of two embodiments of the image acquiring device 100 related to the present disclosure.

Referring to FIG. 4, the image acquiring device 100 may include a single camera printed circuit board (PCB) 410 for mounting the light source portion 200, and the sensor portion 300. Alternatively, the light source portion 200 and the sensor portion 300 may be separately mounted on a plurality of PCBs and connected to each other.

The mounted light source portion 200 and the sensor portion 300 need to be in sync with each other so that the light source portion 200 can be activated in an attempt to acquire an image. As described above, the driver portion 420 may control a pulse of the light source portion 200 or control an on/off state in units of segments. Alternatively, emitters corresponding to respective wavelengths may be sequentially turned on/off. This is on the assumption that a circuit structure of the sensor portion 300 mounted to the PCB 410 has a circuit configuration that can be performed by the above-described control.

Suppose that a direction in which the light source portion 200 and the sensor portion 300 are exposed in the image acquiring device 100 is defined as a first direction. In this case, the camera PCB 410 may be disposed perpendicular to the first direction, the light source portion 200 may be disposed with a light emitting direction coinciding with the first direction, and the sensor portion 300 may be disposed to receive light coming in a direction opposite to the first direction.

A single light source portion 200 and a single sensor portion 300 may be provided. The light source portion 200 and the sensor portion 300 may be disposed side by side adjacent to each other in a second direction perpendicular to the first direction on the camera PCB 410. The driver portion 420 may be provided outside both the light source portion 200 and the sensor portion 300 so that the light source portion 200 and the sensor portion 300 can be adjacent to each other without any intervention.

A combination of one light source portion 200 and one sensor portion 300 may acquire a two-dimensional (2D) image.

Referring to FIG. 5, the image acquiring device 100 may include one light source portion 200 and two sensor portions 300. This embodiment has the same features as those of the image acquiring device 100 of FIG. 4 within the scope not contradicting the spirit of the present disclosure.

When there are the two sensor portions 300, a three-dimensional (3D) image may be obtained. In this case, the image acquiring device 100 may additionally include a depth processor. The depth processor may be used to acquire depth information through the two sensor portions 300.

FIGS. 6 to 12 are conceptual views of some embodiments of the light source portion 200 related to the present disclosure.

The embodiments of FIGS. 6 to 10 and 13 may all have a segment 1. A plurality of segments 1 in the light source portion 200 may be driven independently. That is, the plurality of segments 1 may not be driven at the same time, but may be sequentially driven at different times. Furthermore, a driving time interval and a driving strength may also be adjusted differently. For example, the plurality of segments 1 may have directionality and may be driven sequentially. When the plurality of segments 1 is defined on the basis of (row, column), the plurality of segments 1 may be driven in the order of (1, 1), (1, 2), (1, 3), (1, 4), (2, 1), (2, 2), and so on.

The plurality of segments 1 of the light source portion 200 may be arranged in an m*n matrix, and a plurality of emitters 211 in each segment 1 may be arranged in a p*q matrix. Such arrangement in a matrix may improve integration and may take the advantage of divisional driving because each region is clearly distinguished from one another.

Figure 9:
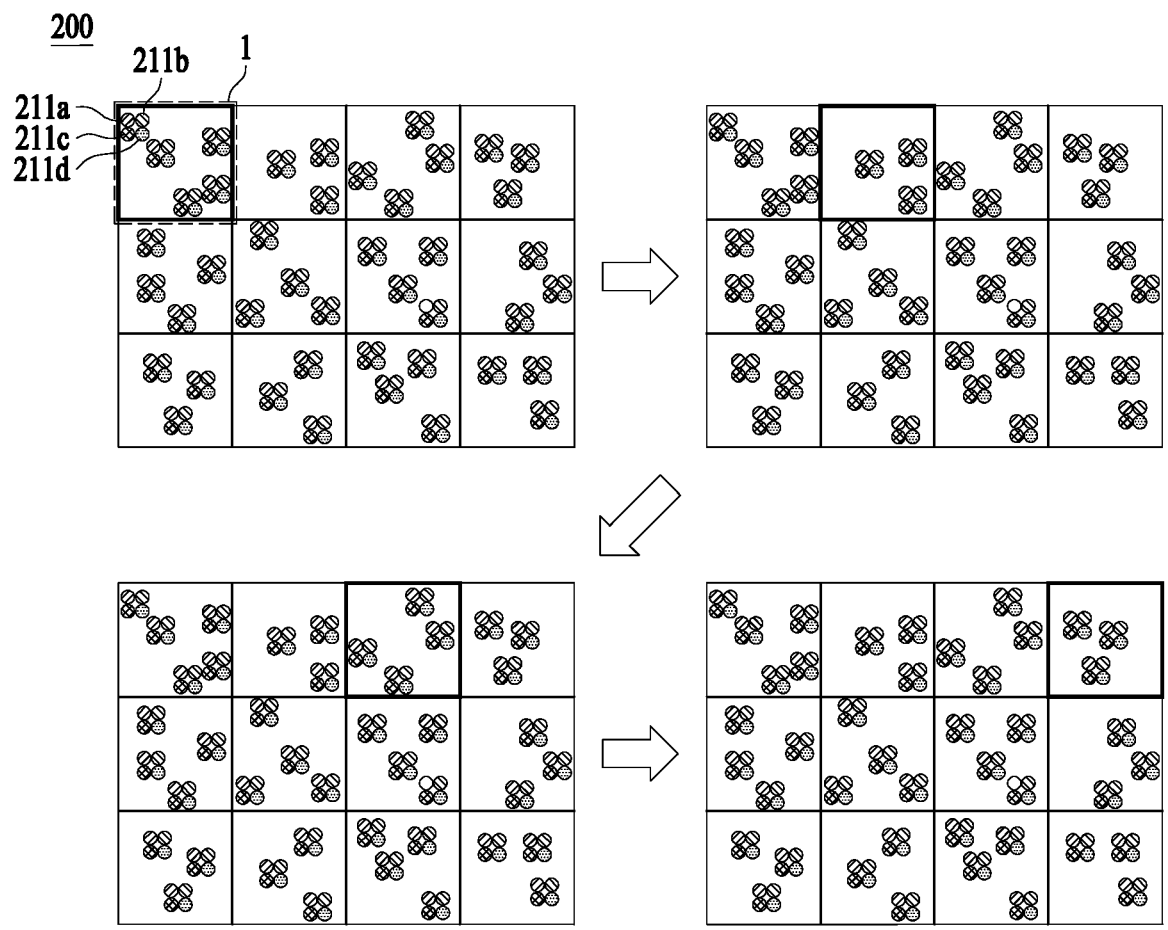
FIG. 9 is conceptual diagram of one embodiment of a light source portion related to the present disclosure.
Figure 10:
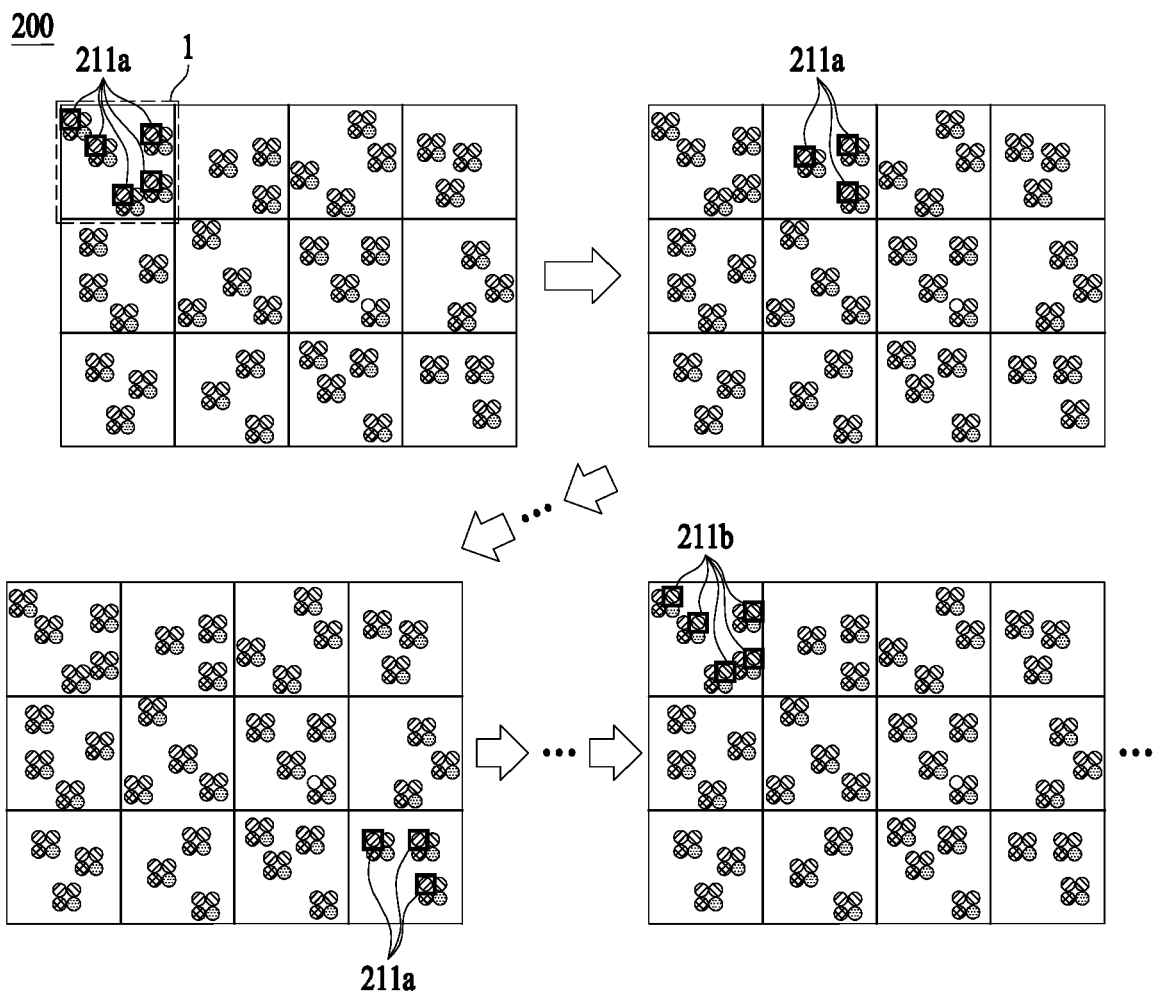
FIG. 10 is conceptual diagram of one embodiment of a light source portion related to the present disclosure.

However, the arrangement of the segments is not necessarily limited the aforementioned example. The arrangement of the segments may take a circular shape, a polygonal shape, or even an irregular shape. FIGS. 9 and 10 illustrate embodiments in which the emitters 211 are not arranged in a matrix.

Figure 6:
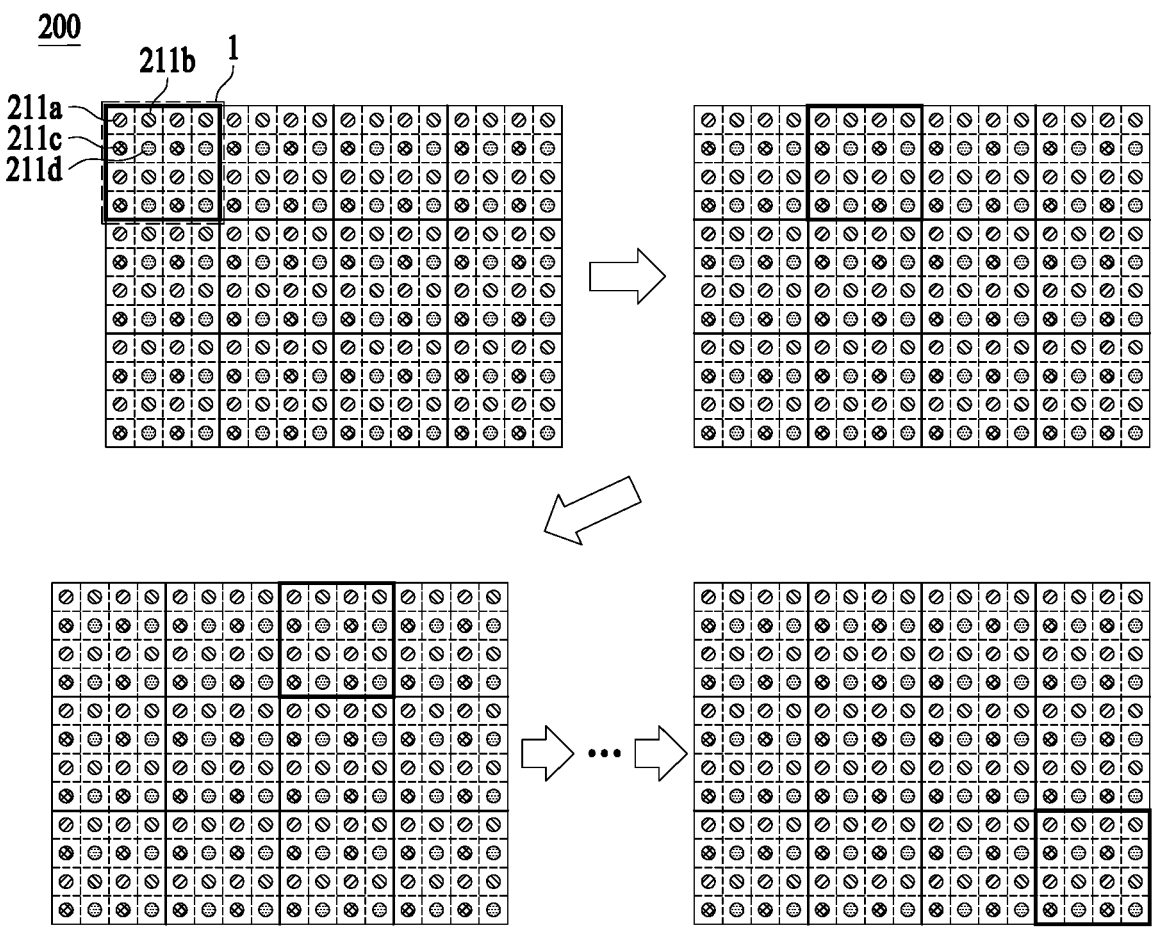
FIG. 6 is conceptual diagram of one embodiment of a light source portion related to the present disclosure.
Figure 7:
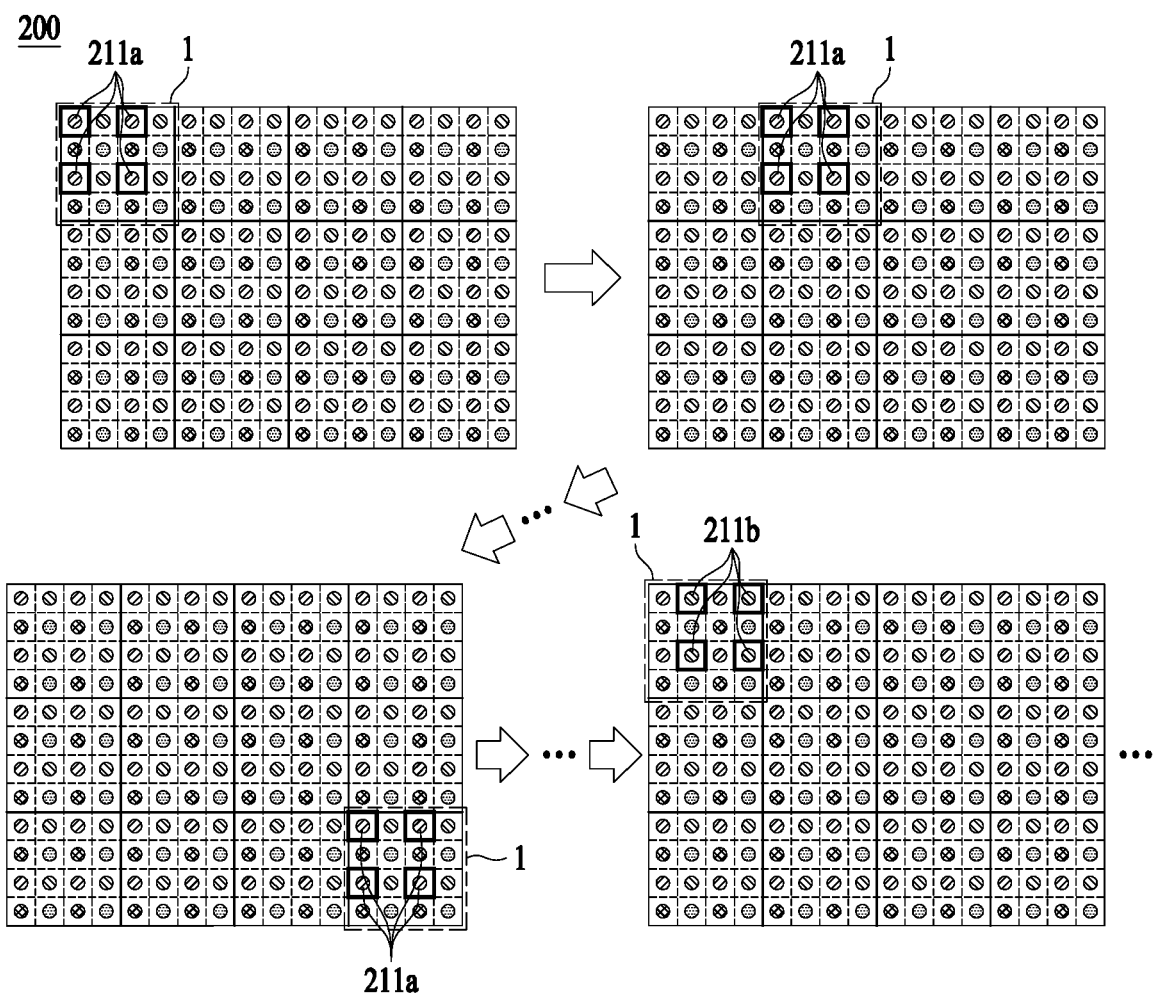
FIG. 7 is conceptual diagram of one embodiment of a light source portion related to the present disclosure.
Figure 8:
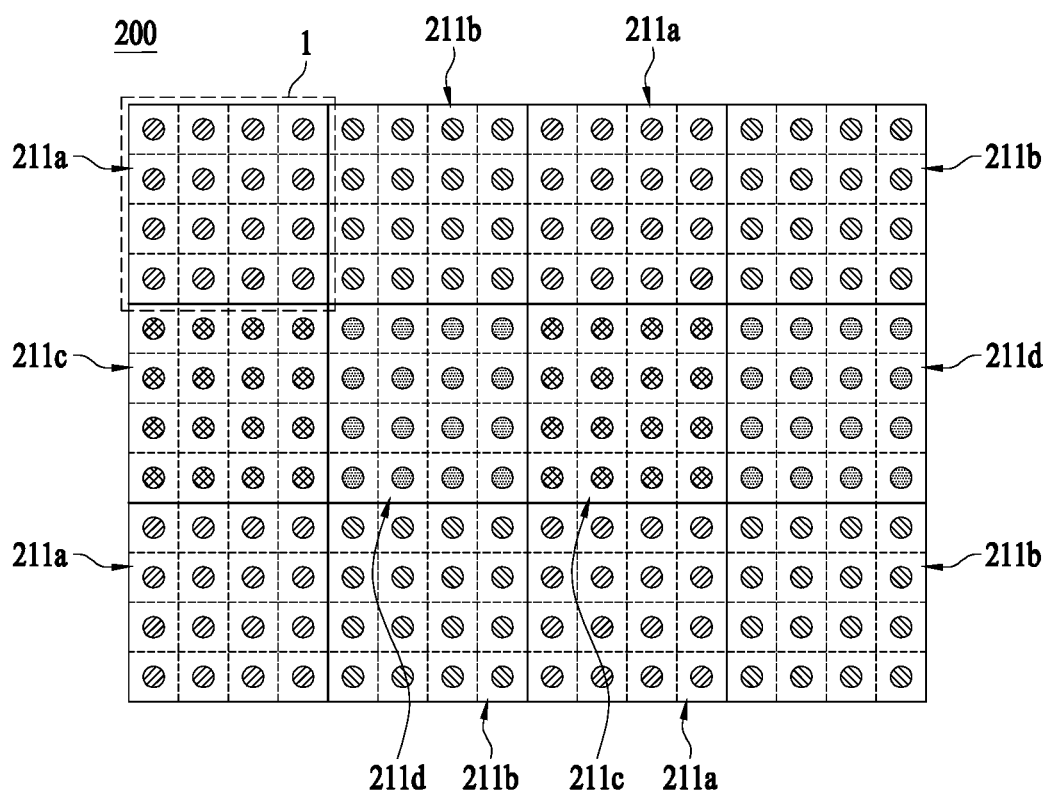
FIG. 8 is conceptual diagram of one embodiment of a light source portion related to the present disclosure.
Figure 11:
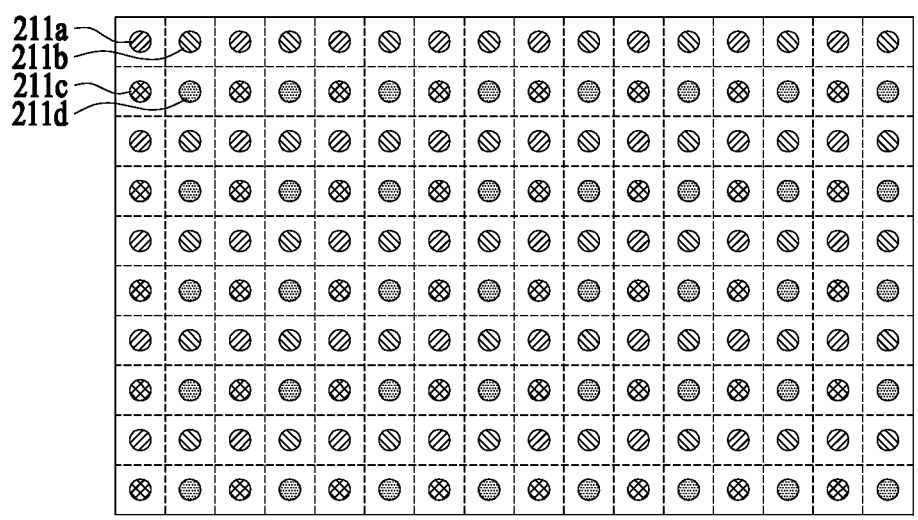
FIG. 11 is conceptual diagram of one embodiment of a light source portion related to the present disclosure.
Figure 12:
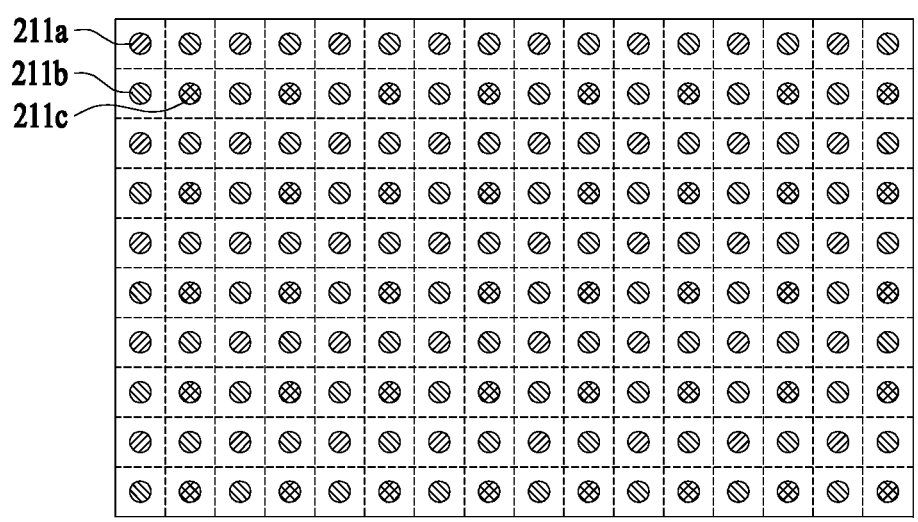
FIG. 12 is conceptual diagram of one embodiment of a light source portion related to the present disclosure.

The embodiments of FIGS. 6 to 10 show an example in which a plurality of groups of emitters 211 is included in each segment 1, and the embodiment of FIG. 8 shows an example in which a single group of emitters 211 is included in each segment 1. FIGS. 11 and 12 show an emitter portion 210 that is not divided into segments.

Referring to FIG. 6, when the segments 1 are sequentially driven, a plurality of groups of emitters 211 in a driven segment 1 may be driven at the same time. For example, suppose that each segment 1 includes an R-wavelength emitter 211*a*, a G-wavelength emitter 211*b*, a B-wavelength emitter 211*c*, and an IR-wavelength emitter 211*d*. In this case, when each segment 1 is driven, the R-wavelength emitter 211*a*, the G-wavelength emitter 211*b*, the B-wavelength emitter 211*c* and the IR-wavelength emitter 211*d* may be all turned on or off at the same time. In addition, this means that the sensor portion should be driven as a temporal multi-sensor portion or a spatial multi-sensor portion since the plurality of groups of emitters is not driven at different times.

The embodiment of FIG. 7 may have the same arrangement as that of the embodiment of FIG. 6, and may implement a sequential driving of the same segments 1.

However, unlike the embodiment of FIG. 6, different groups of emitters 211 in the same segment 1 may be driven at different times. For example, the R-wavelength emitter 211*a* may be driven in the order of segment (1, 1), segment (1, 2), segment (1, 3), . . . , and the last segment 1, and then the G-wavelength emitter 211*b* may be driven in the order of segment (1, 1), segment (1, 2), segment (1, 3), . . . , and the last segment 1. As such, the all wavelength emitters 211 may be driven in accordance with this rule.

The above example corresponds to the case where the plurality of groups of emitters 211 are driven at different times. Thus, not just when the sensor portion is implemented in the form of a spatial multi-sensor portion or a temporal multi-sensor portion, but also when the sensor portion is implemented in the form of a mono sensor, it is possible to acquire an image including a plurality of wavelength components.

In the embodiment related to FIG. 8, unlike the embodiments of FIG. 6 or 7, each segment 1 may include the same group of emitters 211. In addition, when one segment 1 is driven, all emitters included in the corresponding segment 1 may be driven at the same time.

This embodiment may also correspond to the same result obtained when driving the plurality of groups of emitters 211 at the same time. Thus, not just when the sensor portion is implemented in the form of a spatial multi-sensor portion or a temporal multi-sensor portion, but also when the sensor portion is implemented in the form of a mono sensor, it is possible to acquire an image including a plurality of wavelength components.

The shape of a segment 1 including the same group of emitters 211 has different efficiency characteristics according to a wavelength, and thus, it is possible to control segments at different strengths according to a wavelength.

In FIGS. 9 and 10, unlike the above-described embodiments of FIGS. 6 to 8, emitters 211 in a segment 1 may be arranged irregularly. That is, a plurality of emitters 211 in one segment 1 may be arranged so that the plurality of emitters 211 is not bilaterally symmetrical, vertically symmetrical, or origin symmetrical. The irregular arrangement in one segment 1 may provide a reference point to divide the space. Therefore, such arrangement may be useful to acquire a 3D image as shown in the embodiment of FIG. 5.

In addition, irregular arrangement of emitters 211 in one segment 1 may be different from arrangement of emitters 211 in another segment 1. The irregular arrangement among a plurality of segments 1 may be useful not only to acquire a 3D image, but also to distinguish a segment 1 of a light source portion.

In particular, the embodiment of FIG. 9 shows that a plurality of groups of emitters 211 in a segment 1 are driven at the same time, as in the embodiment of FIG. 6, and the embodiment of FIG. 10 shows that different groups of emitters 211 in the same segment are driven at different times, as in FIG. 7. Specific characteristics have been already described above with reference to FIGS. 6 and 7.

As shown in FIGS. 11 and 12, the light source portion 200 may be driven in units of each emitter 211 in a di without employing the concept of the segments 1. For example, there may be an emitter portion 210 having a combination of four wavelengths, as shown in FIG. 11, or an emitter portion 210 having a combination of three wavelengths, as shown in FIG. 12. Specifically, the four wavelengths may an R-wavelength, a G-wavelength, a B-wavelength, and an IR-wavelength, and the three wavelengths may be an R-wavelength, a G-wavelength, or a B-wavelength. However, the types of the wavelengths are not limited thereto and may vary when necessary.

Furthermore, as described above, each emitter 211 may be implemented in the form of VCSEL in all of the above-described embodiments of FIGS. 6 to 12 and even in the embodiment of FIG. 13 described below.

Figure 13:
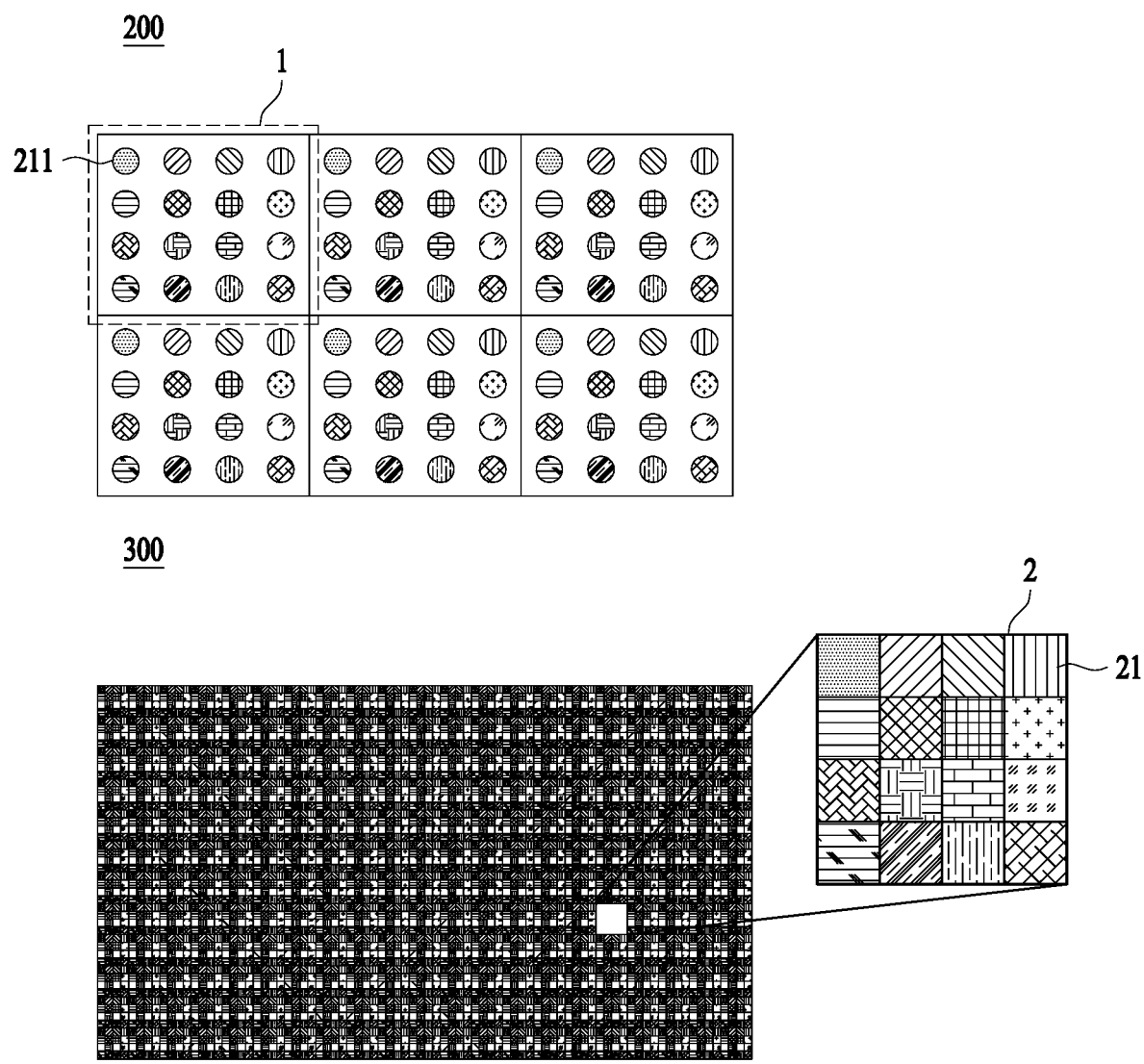
FIG. 13 is a conceptual diagram of another embodiment of a light source and a sensor portion related to the present disclosure.

FIG. 13 is a conceptual diagram of another embodiment of the light source portion 200 and the sensor portion 300 related to the present disclosure.

In the case where a spatial multi-sensor portion is implemented, the arrangement of filters according to wavelengths may be formed such that the minimum unit of repetition of a pixel pattern having different wavelength (hereinafter, referred to as a unit pixel 2) is repeated.

A pattern of arrangement of pixels 21 in a unit pixel 2 and a pattern of arrangement of emitters 211 in a segment 1 of the light source portion 200 may correspond to each other. For example, based on the arrangement in a 4*4 matrix, 16 pixels 21 corresponding to the unit pixel 2, may receive light of different wavelengths, respectively.

Accordingly, the segment 1 of the light source portion 200 may also be provided with 16 groups of emitters 211 arranged in a 4*4 matrix to correspond to the 16 pixels 21 that is included in a unit pixel 2. Wavelengths at positions where the respective pixels 21 and the emitters 211 correspond to each other may fall into the same band or close bands. For example, a wavelength of light received by pixel (1, 1) corresponding to the unit pixel 2 may be identical to a wavelength of an emitter 211 positioned at (1, 1) in the segment 1, and a wavelength of light received by pixel (1, 2) corresponding to the unit pixel 2 may be identical to a wavelength of the emitter 211 positioned at (1, 2) in the segment 1. When the light source portion 200 and the sensor portion 300 are provided in the same pattern, a distance between each pixel 21 and an emitter 211 corresponding thereto may be minimized, thereby improving efficiency.

In some cases, the number of pixels 21 in a unit pixel 2 and the number of emitters 211 in a segment 1 may not be equal. In addition, the number of wavelengths included in the unit pixel 2 includes and the number of wavelengths included in the segment 1 may be different. For example, when the unit pixel 2 is composed of pixels 21 of different wavelengths in a 4*4 matrix, the light source portion 200 may be provided with emitters 211 whose groups correspond to the pixels 21 of the different wavelengths. In this case, the emitters 211 may be divided into 2*2 segments 1 and driven in units of segments.

Pixels 21 of which wavelength are numerically close to each other in a unit pixel 2 may be provided spatially adjacent to each other. This characteristic may be equally applied to the light source portion 200 as well as the sensor portion 300. When neighboring wavelengths are spatially adjacent to each other, there is an advantage of maximizing light emitting efficiency and light receiving efficiency.

Also, the driver portion may be driven so that brightness of emitters 211 in a segment 1 positioned at an outer side among the plurality of segments 1 is brighter than brightness of emitters 211 of a segment 1 positioned at an inner side among the plurality of segments 1. Since the brightness of the outer side of the light source portion 200 is usually darker than the brightness of the inner side, more energy may be supplied to the outer region. This characteristic is not limited to this embodiment, but may be equally applied to all embodiments.

By controlling segments individually as described above, the image acquiring device may use power efficiently and may be advantageous especially in terms of peak power. If the peak power is lowered, this may enable the use of a small device. In conclusion, it is possible to help make the image acquiring device small and compact.

Effects of the image acquiring device according to the present disclosure are as follows.

According to at least one of the embodiments of the present disclosure, it is possible to implement a small device capable of acquiring a multispectral or hyperspectral image.

Further, according to at least one of the embodiments of the present disclosure, it is possible to reduce power consumption required to acquire a multispectral or hyperspectral image.

Further, according to at least one of the embodiments of the present disclosure, it is possible to acquire various types of multispectral or hyperspectral images, thereby increasing usability.

Further, according to at least one of the embodiments of the present disclosure, it is possible to improve wavelength resolution of an image, thereby increasing usability.

Additional range of applicability of the present disclosure will become clear from the detailed description of the invention in the following. Yet, since it will be apparent to those skilled in the art that various modifications and variations can be made therein without departing from the spirit and scope of the invention, it is to be understood that the following detailed description of the present disclosure and a specific embodiment such as a preferred embodiment of the present disclosure are exemplary and explanatory.

It is understood by those skilled in the art that the present features can be embodied in several forms without departing from the characteristics thereof.

The above description is to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

What is claimed is:

1. An image acquiring device comprising:
a light source portion; and
a sensor portion,
wherein the light source portion comprises:
an emitter portion having a plurality of groups of emitters configured to emit light of different wavelengths, wherein each of the plurality of groups corresponds to a respective wavelength of the different wavelengths;
a circuit portion configured to independently control a plurality of segments into which the emitter portion is divided; and
a driver portion configured to control the circuit portion so that the plurality of segments are driven at different strengths or at different times,
wherein each of the plurality of segments has a plurality of emitters arranged in a same pattern,
wherein the sensor portion is divided into regions to form a unit pixel that corresponds to a minimum unit for receiving light of a plurality of wavelengths, the unit pixel includes a plurality of pixels, and a wavelength pattern of the pixels in the unit pixel corresponds to a wavelength pattern of emitters provided in each of the plurality of segments, and
wherein pixels corresponding to wavelengths adjacent to each other in measurement are provided spatially adjacent to each other in the unit pixel.

2. The image acquiring device of claim 1, wherein each of the plurality of segments comprises a plurality of groups of emitters.

3. The image acquiring device of claim 2, wherein the driver portion is configured to drive the plurality of segments sequentially.

4. The image acquiring device of claim 3, wherein:
the driver portion is driven so that a plurality of emitters belonging to a same segment are all driven at a same time; and
the sensor portion is configured to change a wavelength of received light according to a time or a region.

5. The image acquiring device of claim 3, wherein, after a first group of emitters is driven according to a driving order of the plurality of segments, a second group of emitters is sequentially driven according to the driving order of the plurality of segments.

6. The image acquiring device of claim 5, wherein the sensor portion is configured to change a wavelength of received light according to a time or a region or to receive light regardless of wavelength.

7. The image acquiring device of claim 5, wherein a duration during which one of the plurality of groups of emitters is driven with respect to all of the plurality of segments corresponds to a unit frame time of the image acquiring device.

8. The image acquiring device of claim 1, wherein each of the plurality of segments comprises one group of the plurality of groups of emitters.

9. The image acquiring device of claim 1, wherein:
the plurality of segments is arranged in an m*n matrix, where m and n denote natural numbers; and
a plurality of emitters in each segment is arranged in a p*q matrix, where p and q denote natural numbers.

10. The image acquiring device of claim 1, wherein the plurality of groups of emitters comprises an R-wavelength emitter, a G-wavelength emitter, a B-wavelength emitter, and an IR-wavelength emitter.

11. The image acquiring device of claim 1, wherein the plurality of groups of emitters correspond to vertical cavity surface emitting lasers (VCSELs).

12. The image acquiring device of claim 1, wherein:
the sensor portion is provided as at least two sensor subportions; and
a pattern of arrangement of emitters in a first segment of the plurality of segments is different from a pattern of arrangement of emitters in a second segment of the plurality of segments.

13. The image acquiring device of claim 1, wherein the driver portion is further configured to drive a plurality of emitters in a manner in which a brightness of emitters in an outer segment among the plurality of segments is brighter than brightness of emitters in an inner segment among the plurality of segments.

* * * * *